US006337816B1

United States Patent
Park et al.

(10) Patent No.: US 6,337,816 B1
(45) Date of Patent: Jan. 8, 2002

(54) COLUMN REDUNDANCY CIRCUIT FOR SEMICONDUCTOR MEMORY

(75) Inventors: San Ha Park, Cheongju; Ju Han Kim, Suwon; Hong Beom Pyeon, Cheongju, all of (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 09/578,865

(22) Filed: May 26, 2000

(30) Foreign Application Priority Data

May 27, 1999 (KR) .......................................... 99/19240

(51) Int. Cl.[7] ............................................... G11C 7/00
(52) U.S. Cl. ................. 365/200; 365/225.7; 365/230.03
(58) Field of Search ........................... 365/200, 230.03, 365/225.7, 189.01, 230.01

(56) References Cited

U.S. PATENT DOCUMENTS 4,389,715 A    6/1983  Eaton, Jr. et al.
4,727,516 A    2/1988  Yoshida et al.
5,265,055 A   11/1993  Horiguchi et al.
5,742,547 A  * 4/1998  Lee ............................ 365/200
6,154,389 A  * 11/2000 Chung et al. ........... 365/185.09

* cited by examiner

Primary Examiner—David Nelms
Assistant Examiner—Hoai V. Ho

(57) ABSTRACT

The present invention relates to a column redundancy circuit for a semiconductor memory whose memory array is divided into a plurality of array units to be properly operated at a high frequency. The plurality of array units in the memory array include a plurality of normal memory cells and a plurality of redundancy memory cells. The normal data stored in the normal memory cells and the redundancy data stored in the redundancy memory cells are outputted to a switch unit. A column redundancy unit outputs a redundancy enable signal according to a column address, a row address and a fuse short state. According to the logical state of the redundancy enable signal, the switch unit selects the normal data or redundancy data from the memory array, and outputs it to a main amplifier.

16 Claims, 8 Drawing Sheets

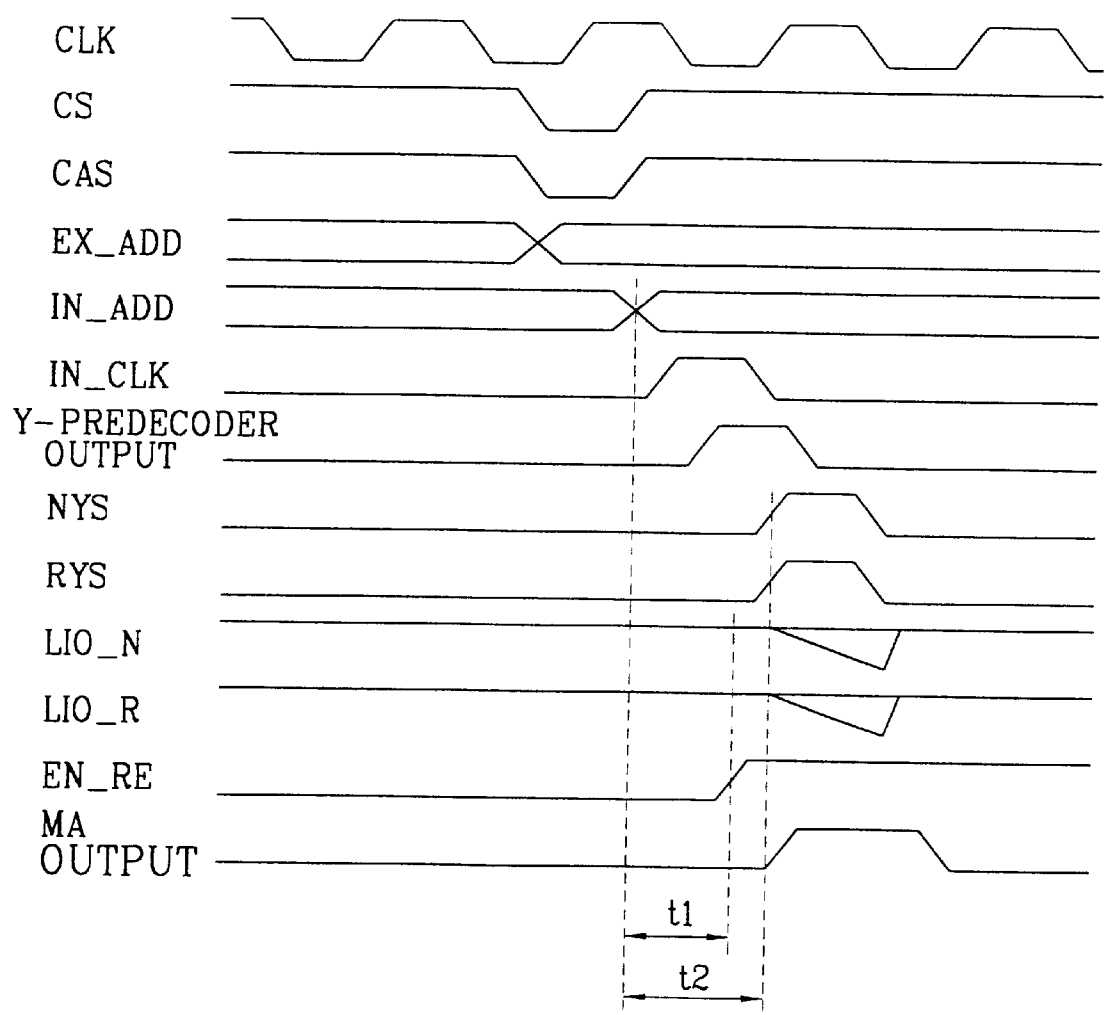

COLUMN REDUNDANCY CIRCUIT FOR SEMICONDUCTOR MEMORY

BACKGROUND OF THE INVENTION

1. Field of the Invention

The present invention relates to a column redundancy circuit for a semiconductor memory. In particular, the invention relates to a column redundancy circuit for a semiconductor memory which facilitates the proper operation at high frequency of a high integration semiconductor circuit, whose memory array is divided into a plurality of array units, by selecting one of a normal data and a redundancy data which are outputted from the memory array.

2. Description of the Related Art

A column redundancy circuit using a column address signal as an input and connected to a memory array is known as a conventional column redundancy circuit. FIG. 1 is a block diagram illustrating the conventional column redundancy circuit.

A clock buffer 1 buffers an external clock signal EX_CLK, and outputs the buffered clock to a pulse width control unit 5. An address buffer 2 buffers an external address EX_ADD, and outputs the buffered address to both an address counter 3 and a column predecoder 6. In a burst mode, the address counter 3 counts the buffered external address EX_ADD, and outputs an internal address IN_ADD to a column redundancy unit 4 and the column predecoder 6. The column redundancy unit 4 determines whether to repair each memory array unit according to the external address EX_ADD and the input internal address IN_ADD, and outputs corresponding redundancy information RE_INF to a pulse width control unit 5.

The pulse width control unit 5 serves to output to the column predecoder 6 the internal clock signal IN_CLK for determining a pulse width of a column selecting signal according to the buffered external clock signal EX_CLK, and to output to a column decoder 7 a redundancy clock signal CLK_RE_INF having the redundancy information RE_INF.

The column predecoder 6 enables a normal address path in a non-redundancy mode, i.e., where a repair operation is not performed. Conversely, the column predecoder 6 disables the normal address path in a redundancy mode (i.e., where the repair operation is carried out), predecodes a column address from the address buffer 2, and outputs the predecoded column address Y_ADD to the column decoder 7. A pulse width of the predecoded column address Y_ADD is determined by the external clock signal EX_CLK from the clock buffer 1.

The column decoder 7 determines whether to repair according to the redundancy clock signal CLK_RE_INF, and outputs a normal column selecting signal NYS or a redundancy column selecting signal RYS to a memory array 8. That is, the column decoder 7 outputs the normal column selecting signal NYS when in the non-redundancy mode, and outputs the redundancy column selecting signal RYS when in the redundancy mode. The normal column selecting signal NYS and the redundancy column selecting signal RYS are signals for selecting a sense amplifier (not shown) in the memory array 8.

The memory array 8 consists of a plurality of normal memory cells and a plurality of redundancy memory cells. When the column decoder 7 outputs the normal column selecting signal NYS, the data stored in the normal memory cells of the memory array are read. When the column decoder 7 outputs the redundancy column selecting signal RYS, the data stored in the redundancy memory cells of the memory array 8 are read. The data read are inputted to a main amplifier 9 via an input/output line LIOT/B, amplified and sent to an output buffer (not shown).

FIGS. 2A and 2B are timing diagrams of the circuit in FIG. 1. FIG. 2A is a timing diagram in the non-redundancy mode, and FIG. 2B is a timing diagram in the redundancy mode. As shown in both figures, when the external clock signal EX_CLK is inputted, if a column address strobe signal CAS is inputted, the external address EX_ADD and the internal address IN_ADD change state. When a first predetermined time t1 lapses after the internal address IN_ADD transitions in a non-redundancy mode, the redundancy information signal RE_INF is at a high level, and the redundancy clock signal is also at a high level. That the redundancy information signal RE_INF is at a high level implies that the column redundancy circuit is operating in the non-redundancy mode. That the redundancy information signal RE_INF is at a low level means that the column redundancy circuit is operating in the redundancy mode.

When a second predetermined time t2 lapses after the first predetermined time t1, the normal column selecting signal NYS is enabled in the non-redundancy mode, as shown in FIG. 2A, and the redundancy column selecting signal RYS is enabled in the redundancy mode, as depicted in FIG. 2B.

The second predetermined time t2 is for determining whether the column predecoder 6 and the column decoder 7 operate the column redundancy circuit in the non-redundancy mode or the redundancy mode. This second predetermined time t2 is identical in the normal mode and the redundancy mode.

The second predetermined time t2 is clearly longer than when the normal column selecting signal NYS is outputted without a determination of whether to repair. As the second predetermined time t2 becomes longer, the overall processing speed of the column redundancy circuit is delayed.

In order to overcome such a disadvantage, another conventional redundancy circuit is provided.

FIG. 3 is a block diagram illustrating such a conventional redundancy circuit, As shown therein, the clock buffer 1, the address buffer 2 and the address counter 3 are identical in constitution and operation to those in FIG. 1. A pulse width control unit 31 outputs to a column predecoder 32 an internal clock signal IN_CLK for determining a pulse width of a column selecting signal according to a buffered external clock signal EX_CLK. An externally-inputted column address Y_ADD is inputted to a column decoder 33 via the address buffer 2 and then outputted to the column predecoder 32. The column decoder 33 outputs a column selecting signal YS to the memory array 34. Here, the column address Y_ADD and the column selecting signal YS do not relate to a repair operation. The memory array 34 includes normal memory cells and redundancy memory cells. The memory array 34 is not divided into a plurality of array units, unlike the memory array 8 as illustrated in FIG. 1. The data stored in the normal memory cells are inputted to a main amplifier 35 through a normal input/output line NLIOT/B, and the data stored in the redundancy memory cells are inputted to the main amplifier 35 via a redundancy input/output line RLIOT/B.

The column redundancy unit 36 determines whether to use data from the normal input/output line NLIOT/B or the redundancy input/output line RLIOT/B, and outputs redundancy information RE_INF to the main amplifier 35. According to the redundancy information RE_INF, the main amplifier 35 amplifies and outputs one of the data inputted to the normal input/output line NLIOT/B and the redundancy input/output line RLIOT/B.

As described above, in the circuit as shown in FIG. 3, when the column selecting signal YS (identical to the normal column selecting signal NYS as shown in FIG. 1) is outputted to the memory array 34, whether to repair is not determined prior to output, unlike the circuit in FIG. 1. Accordingly, extra time to determine whether to repair is not necessary. Thus, the circuit in FIG. 3 is faster in operation than the circuit in FIG. 1.

However, in FIG. 3 the memory array is not divided into array units, and thus redundancy efficiency is reduced. In addition, if the memory array is divided into a plurality of array units, and hence the number of the array units is increased, a load of the redundancy input/output line RLIOT/B is also increased. Accordingly, in order to employ the circuit of FIG. 3, the number of the array units must be limited. Thus, this circuit is not suitable for a high integration circuit where the memory array is divided into many array units.

SUMMARY OF THE INVENTION

Accordingly, it is an object of the present invention to provide a column redundancy circuit for a semiconductor memory which can improve an operational speed of a high integration semiconductor circuit where a memory array is divided into a number of array units.

In order to achieve the above-described object of the present invention, among others, there is provided a column redundancy circuit for a semiconductor memory, including a memory array including a plurality of array units respectively having a plurality of normal memory cells and a plurality of redundancy memory cells, each array unit outputting a normal data stored in the normal memory cell, and outputting a redundancy data stored in the redundancy memory cell; a column redundancy unit for outputting a redundancy enable signal according to a column address, a row address and a fuse short state; and a switch unit for selecting one of the normal data and the redundancy data from the memory array according to a logical state of the redundancy enable signal, and for outputting the selected data to a main amplifier.

In accordance with another aspect of the invention, a column redundancy circuit for a memory array having a plurality of array units, each array unit outputting a normal data from normal memory cells and a redundancy data from redundancy memory cells, includes a column decoder to output a normal column selecting signal and a redundancy column selecting signal to the memory array based on a column address; a column redundancy unit to output a redundancy enable signal based on the column address; a switch unit to select one of the normal data and the redundancy data output from the memory array based on the redundancy enable signal; and a main amplifier unit to amplify the selected data received from the switch unit.

BRIEF DESCRIPTION OF THE DRAWINGS

The present invention will become better understood with reference to the accompanying drawings, which are given only by way of illustration and thus are not limitative of the present invention, wherein like reference numerals designate like elements, and wherein:

FIG. 7A is a timing diagram of the circuit in FIG. 4 in a non-redundancy mode.

DETAILED DESCRIPTION OF THE INVENTION

A column redundancy circuit for a semiconductor memory in accordance with the present invention will now be described with reference to the accompanying drawings.

Figure 1:
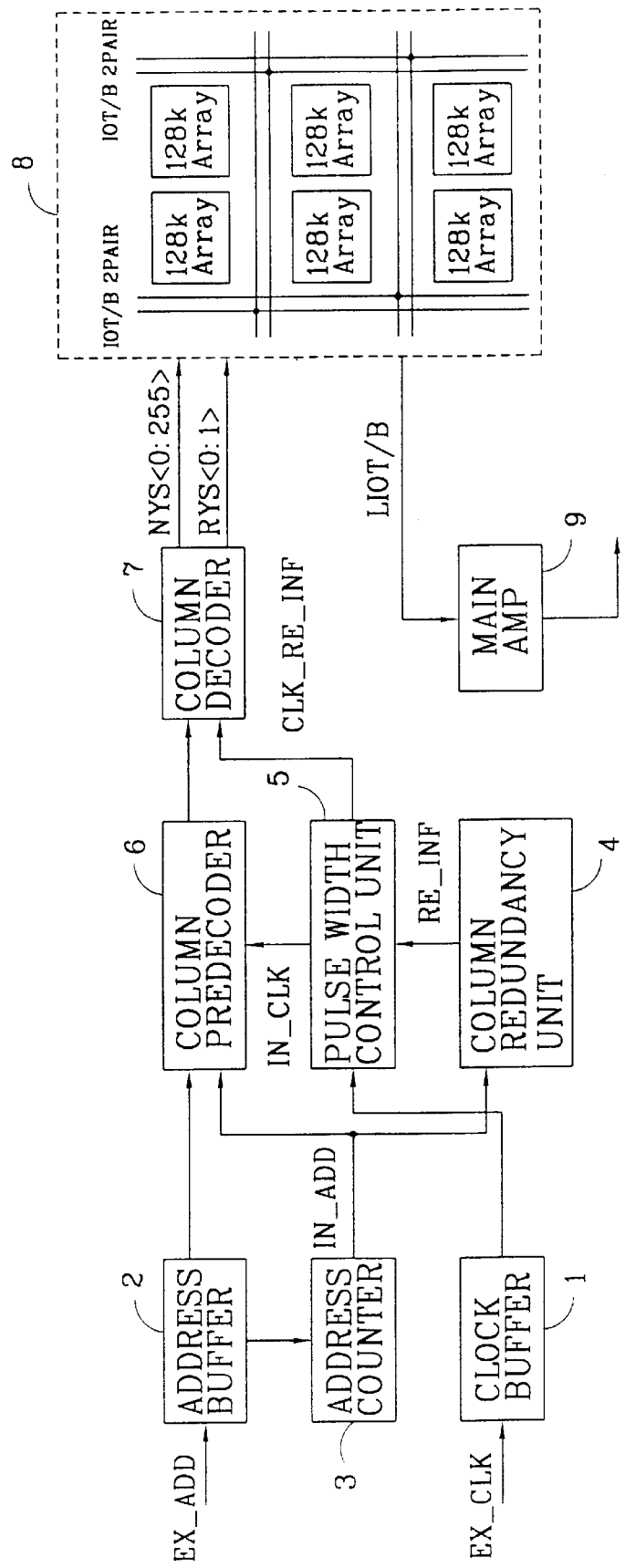
FIG. 1 is a block diagram illustrating a conventional column redundancy circuit which uses a column address of a semiconductor memory.
Figure 4:
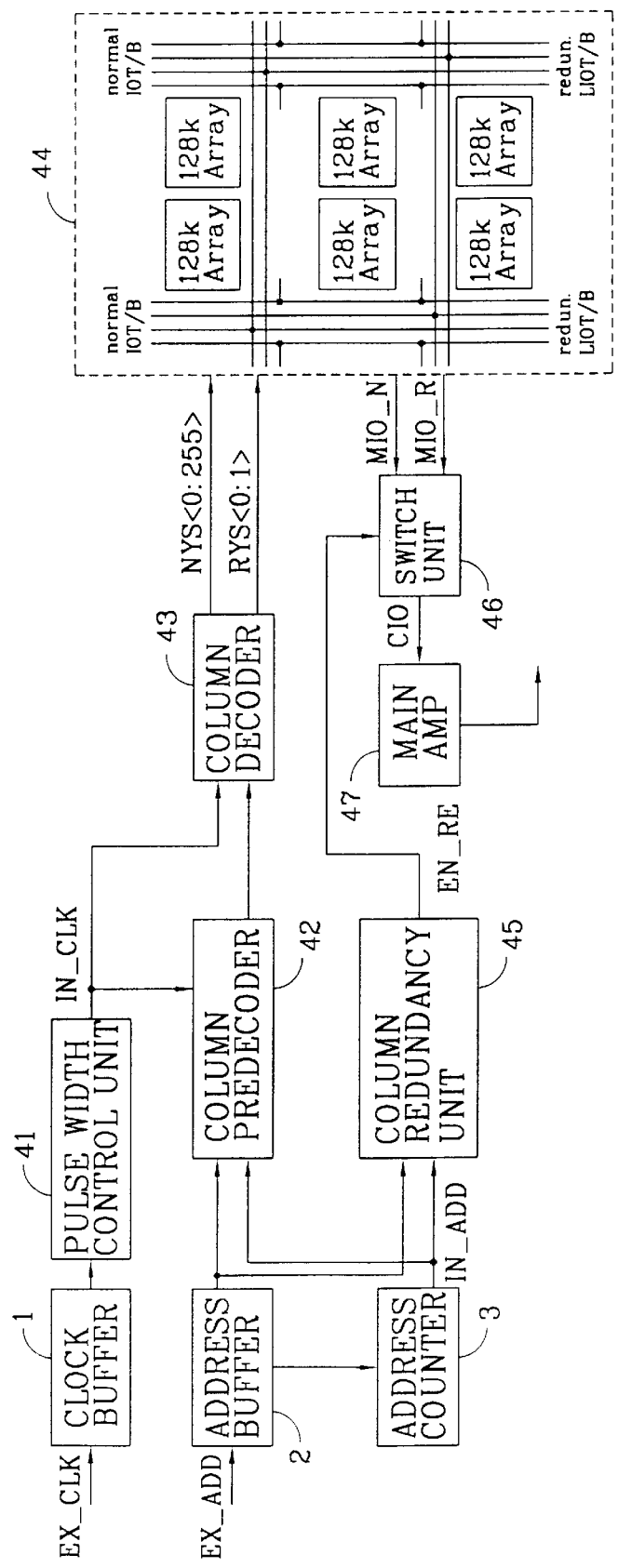
FIG. 4 is a block diagram illustrating a column redundancy circuit which uses a column address of a semiconductor memory in accordance with a preferable embodiment of the present invention.

FIG. 4 is a block diagram illustrating the column redundancy circuit using a column address of the semiconductor memory in accordance with a preferable embodiment of the present invention. The clock buffer 1, the address buffer 2 and the address counter 3 as shown in FIG. 4 are identical in constitution and operation to those as shown in FIG. 1, and thus further description thereof is omitted.

A pulse width control unit 41 outputs an internal clock signal IN_CLK for controlling a pulse width of a column selecting signal to a column predecoder 42 and a column decoder 43 according to an external clock signal EX_CLK buffered in the clock buffer 1. A column decoder 43 receives a predecoded column address and the internal clock signal IN_CLK, and outputs a normal column selecting signal NYS and a redundancy column selecting signal RYS to a memory array 44, regardless of whether operating in a redundancy or a non-redundancy mode.

The memory array 44 includes a plurality of normal memory cells and a plurality of redundancy memory cells. In more detail, referring to FIG. 5, the memory array 44 consists of a plurality of array units 441–446. Each array unit includes the plurality of normal memory cells and the plurality of redundancy memory cells. In addition, each array unit is connected to normal input/output lines LIO_N and local redundancy input/output lines LIO_R. The plurality of normal input/output lines LIO_N are connected to global normal input/output lines MIO_N, and the plurality of local redundancy input/output line LIO_R are connected to global redundancy input/output lines MIO_R.

The normal data stored in the normal memory cells addressed by the normal column selecting signal NYS from the column decoder 43 are outputted to a switch unit 46 through a global normal input/output line MIO_N. The redundancy data stored in the redundancy memory cells addressed by the redundancy column selecting signal RYS from the column decoder 43 are outputted to the switch unit 46 through a global redundancy input/output line MIO_R.

A column redundancy unit 45 receives the external address and the internal address, determines the redundancy mode, and outputs a redundancy enable signal EN_RE to the switch unit 46. In more detail, referring to FIG. 6, the column redundancy unit 45 includes a plurality of enable units 450–457, each outputting a column address true signal Y_ADDT or a column address bar signal Y_ADDB according to row addresses X_ADD0, X_ADD1 (i.e., bits) and fuse states F0, F1. The setting of such fuse states is known in the art, and will not be further explained here. The column redundancy unit 45 also includes a combination unit 460 combining signals outputted from the plurality of enable units 450–457, and outputting the redundancy enable signal EN_RE to the switch unit 46.

Figure 6:
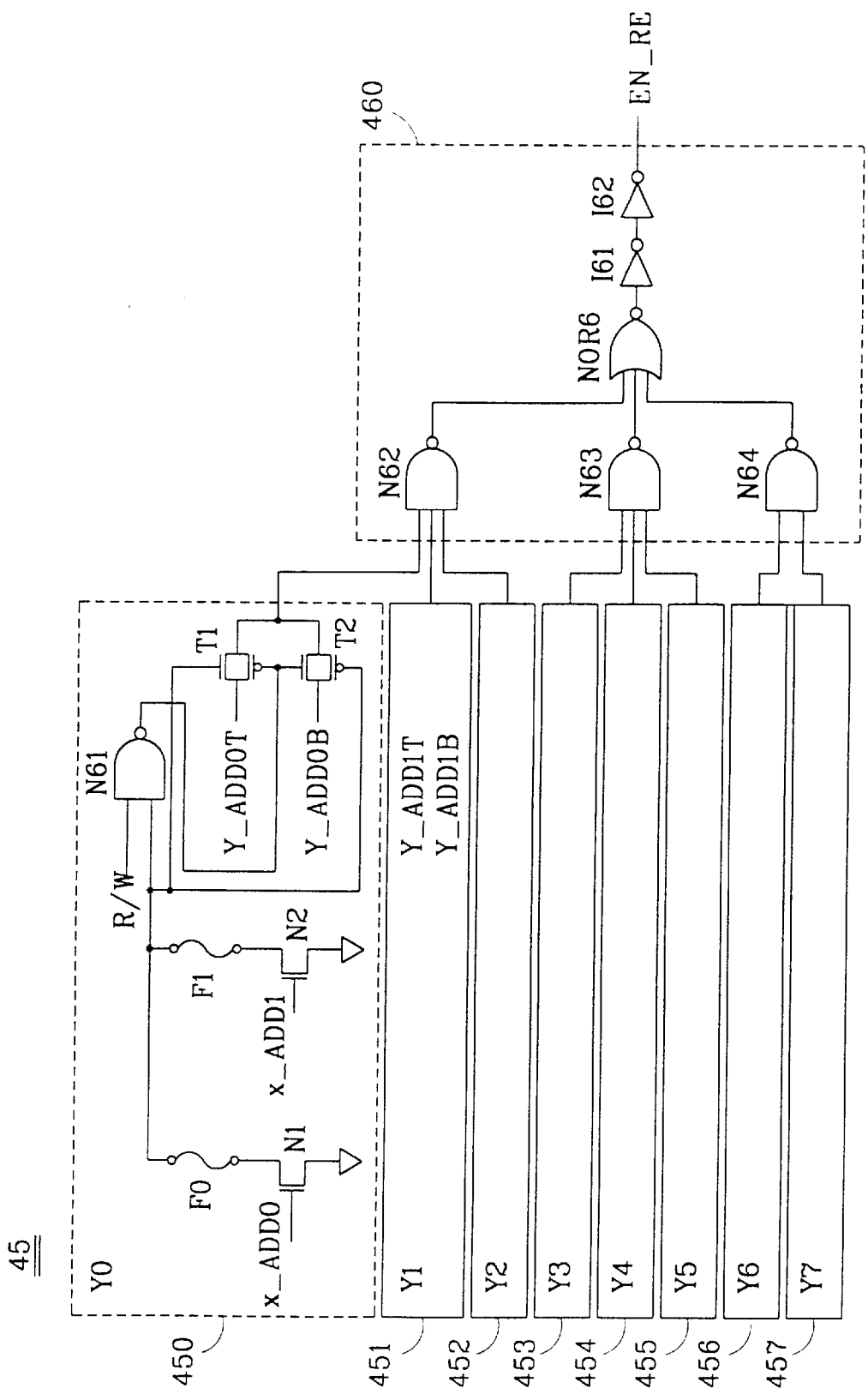
FIG. 6 is a detailed circuit view illustrating a column redundancy unit in FIG. 4.

The number of the plurality of enable units 450–457 is identical to that of the column address bits. A first enable unit 450 includes: a two-input NAND gate N61 receiving a read/write enable signal R/W at one input terminal; a plurality of fuses F0, F1; a plurality of switching transistors N1, N2 having their gate connected to receive row addresses X_ADD0, X_ADD1, and being connected to the other input terminal of the NAND gate N61 through the fuses F0, F1; and two transmission gates T1, T2. FIG. 6 only illustrates two fuses F0, F1 and two switching transistors N1, N2 for convenience. However, the number of transmission gates, fuses and switching transistors is identical to the number of the row address bits.

The two transmission gates T1, T2 are turned on/off according to a level of an output signal from the NAND gate N61 and a level of an input terminal thereof. A first column address true signal Y_ADD0T is passed through the first transmission gate T1, and a first column address bar signal Y_ADD0B is passed through the second transmission gate T2. The first transmission gate T1 and the second transmission gate T2 have a complementary relationship. That is, when the column address true signal Y_ADD0T is passed, the column address bar signal Y_ADD0B is interrupted. Similarly, when the column address bar signal Y_ADD0B is passed, the column address true signal Y_ADD0T is interrupted. The other enable units 451–457 are identical in constitution to the first enable unit 450. However, each enable unit 451–457 outputs different address signals. For instance, the second enable unit 451 selectively outputs a second column address true signal Y_ADD1T or a second column address bar signal Y_ADD1B.

When the column address true signals Y_ADD0T–Y_ADD7T or the column address bar signals Y_ADD0B–Y_ADD7B outputted from the plurality of enable units 450–457 are all at a high level, the combination unit 460 outputs the redundancy enable signal EN_RE having a high level to the switch unit 46. For this embodiment, the combination unit 460 includes: NAND gates N62, N63, N64 NANDing a predetermined number of output signals among the output signals from the enable units 450–457, respectively; a NOR gate NOR6 NORing output signals from the NAND gates N62, N63, N64; and two inverters 161, 162 buffering a level of the output signal from the NOR gate NOR6, and outputting the redundancy enable signal EN_RE.

The operation of the first enable unit 450 will now be explained. It is presumed that the read/write enable signal R/W is enabled (i.e., one input terminal of the first NAND gate N61 is at a high level).

The plurality of row addresses X_ADD0, X_ADD1 which are inputted from the address buffer 2 are sequentially coded. After a first row address X_ADD0 is coded, a second row address X_ADD1 is coded. In case the first row address X_ADD0 is coded, the first switching transistor N1 is turned on. In this state, if the first fuse F0 is disconnected, the terminal at the other side of the first NAND gate N61 is at a high level. Conversely, if the first fuse F0 is connected, the terminal at the other side of the first NAND gate N61 is at a low level.

When the first fuse F0 is disconnected, the NAND gate N61 outputs a low-level signal. As a result, the first transmission gate T1 is turned on, and the column address true signal Y_ADD0T is passed therethrough. Conversely, when the first fuse F0 is not disconnected, namely when the terminal at the other side of the NAND gate is at a low level, the first transmission gate T1 is turned off. Also, the second transmission gate T2 is turned on, and the column address bar signal Y_ADD0B is passed therethrough.

As described above, the first enable unit 450 outputs the first column address true signal Y_ADD0T or the first column address bar signal Y_ADD0B according to whether the fuse corresponding to the X_ADD signal in question is connected or disconnected.

In addition, the second enable unit 451 outputs the second column address true signal Y_ADD1T or the second column address bar signal Y_ADD1B according to whether a corresponding fuse (not shown) is connected or disconnected.

The eight enable units 450–457 respectively output the first to eighth column address true signals Y_ADD0T or the first to eighth column address bar signals Y_ADD0B according to the first address signal X_ADD0 to be coded.

The signals outputted from the first to third enable units 450–452 are NANDed in the second NAND gate N62. The signals outputted from the fourth to sixth enable units 453–455 are NANDed in the third NAND gate N63, and the signals outputted from the seventh and eighth enable units 456, 457 are NANDed in the fourth NAND gate N64. According to the present invention, the address signals respectively outputted from the eight enable units 450–457 are NANDED in the three NAND gates N62–N64. However, the number of the NAND gates may be changed, if necessary.

The switch, unit 46 is enabled by the read/write enable signal R/W, and outputs the redundancy data passing through the global redundancy input/output line MIO_R of the memory array 44 to the main amplifier 47 through an input/output line CIO, or outputs the normal data passing through the global normal input/output line MIO_N of the memory array 44 to the main amplifier 47 through the output line CIO according to the redundancy enable signal EN_RE.

Figure 5:
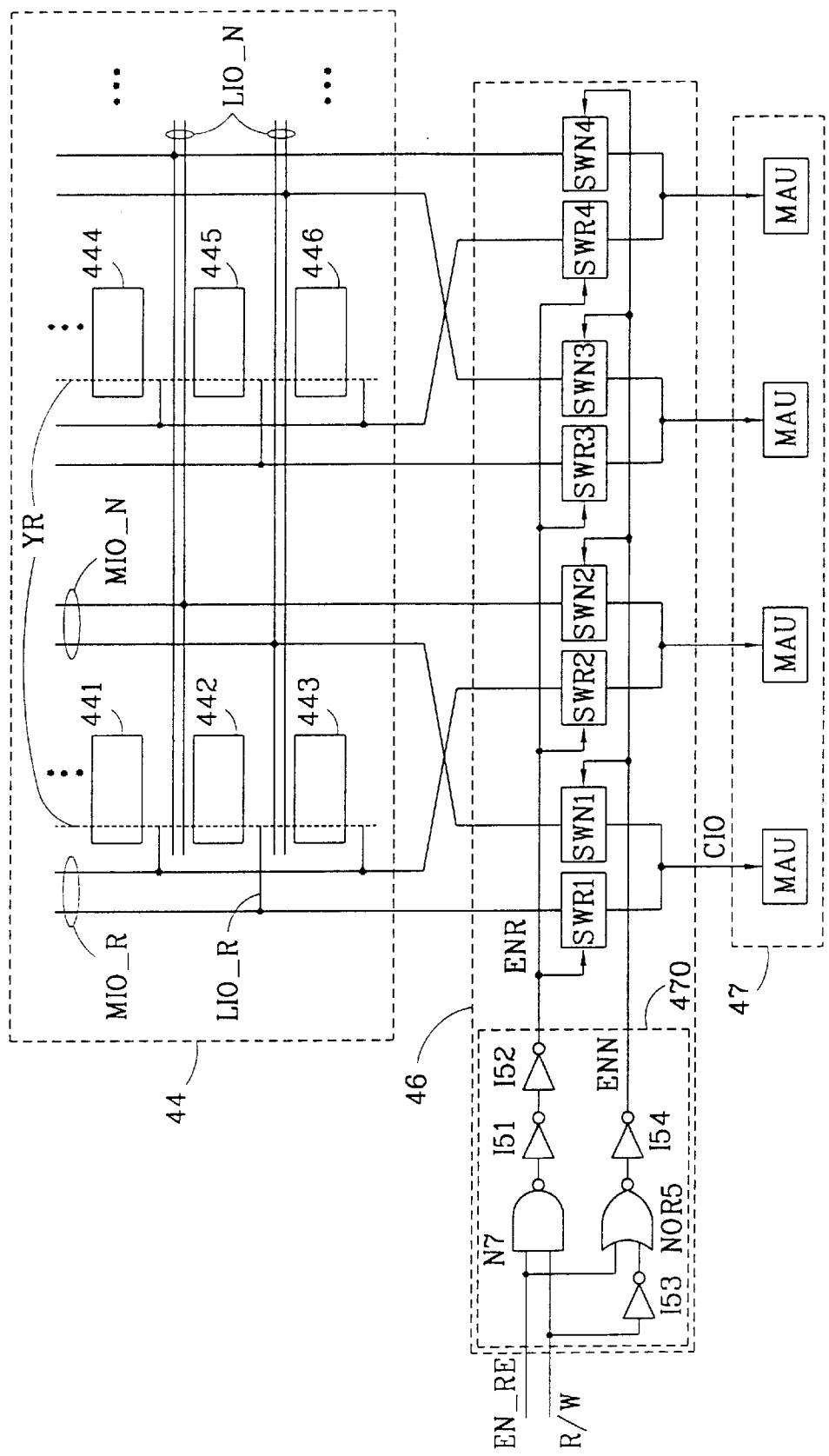
FIG. 5 is a detailed structure view illustrating a memory array, a switch unit, and a main amplifier in FIG. 4.

As illustrated in FIG. 5, the switch unit 46 includes a buffer unit 470 having a NAND gate N7, a NOR gate NOR5 and four inverters I51–I54, and outputting a redundancy switching signal ENR and a normal switching signal ENN. The switch unit 46 also includes a plurality of redundancy switches SWR1–SWR4 switched by the redundancy switching signal ENR, and connecting the global redundancy input/output line MIO_R to the main amplifier 47. A plurality of normal switches SWN1–SWN4 are switched by the normal switching signal ENN, and connect the global normal input/output line MIO_N to the main amplifier 47. The output lines CIO are positioned between the plurality of redundancy switches SWR1–SWR4 and the plurality of normal switches SWN1–SWN4, and connect to the main amplifier 47. Here, a logical level of the redundancy switching signal ENR is opposite to that of the normal switching signal ENN. The plurality of redundancy switches SWR1–SWR4 and the plurality of normal switches SWN1–SWN4 are electrically connected when an inputted signal is at a high level.

The read/write enable signal R/W and the redundancy enable signal EN_RE from the column redundancy unit 45 are NANDed in the NAND gate N5 of the buffer unit 470. The NANDed signal is buffered in the first and second inverters I51, I52, and outputted as the redundancy switching signal ENR. In addition, the read/write enable signal R/W is inverted in the third inverter 153, and NORed with the redundancy enable signal EN_RE in the NOR gate NOR5. The output signal from the NOR gate NOR5 is inverted in the fourth inverter I54, and outputted as the normal switching signal ENN.

When the redundancy enable signal EN_RE is at a low level, the redundancy switching signal ENR becomes a high level, thereby electrically connecting the plurality of redundancy switches SWR1–SWR4. Accordingly, the redundancy data passing through the global redundancy input/output line MIO_R of the memory array 44 is transmitted to the main amplifier 47 through the output line CIO. The normal switching signal ENN becomes a low level, thereby interrupting the plurality of normal switches SWN1–SWN4. Thus, the normal data is not transmitted to the main amplifier 47. Conversely, when the redundancy enable signal EN_RE is at a high level, the plurality of normal switches SWN1–SWN4 are electrically connected. Thus the normal data is transmitted to the main amplifier 47 through the output line CIO.

Figure 2A:
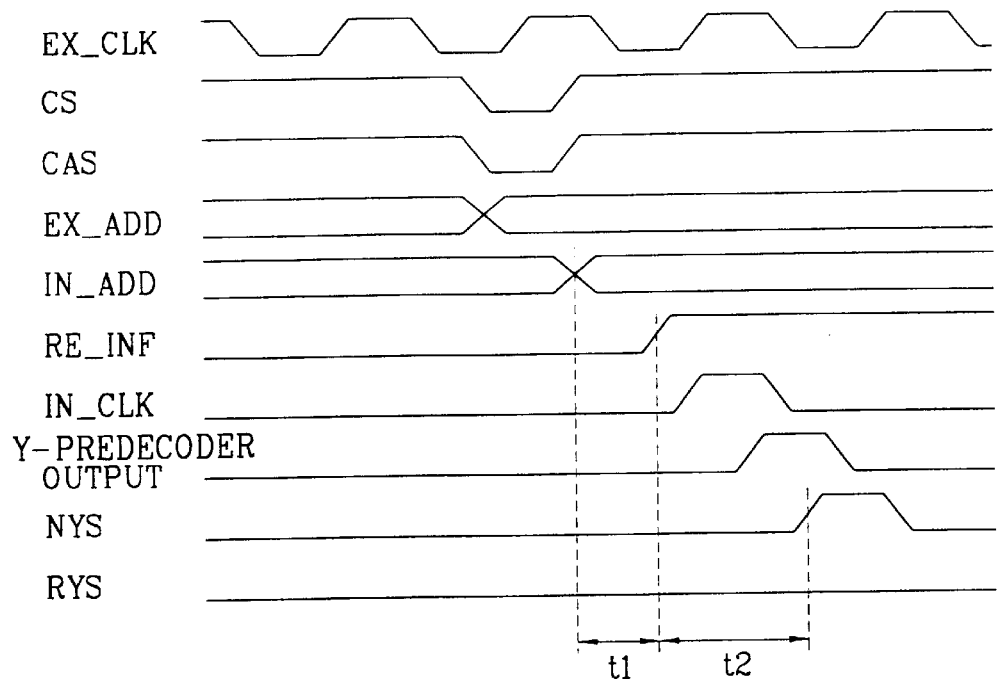
FIG. 2A is a timing diagram of the circuit of FIG. 1 in a non-redundancy mode.
Figure 2B:
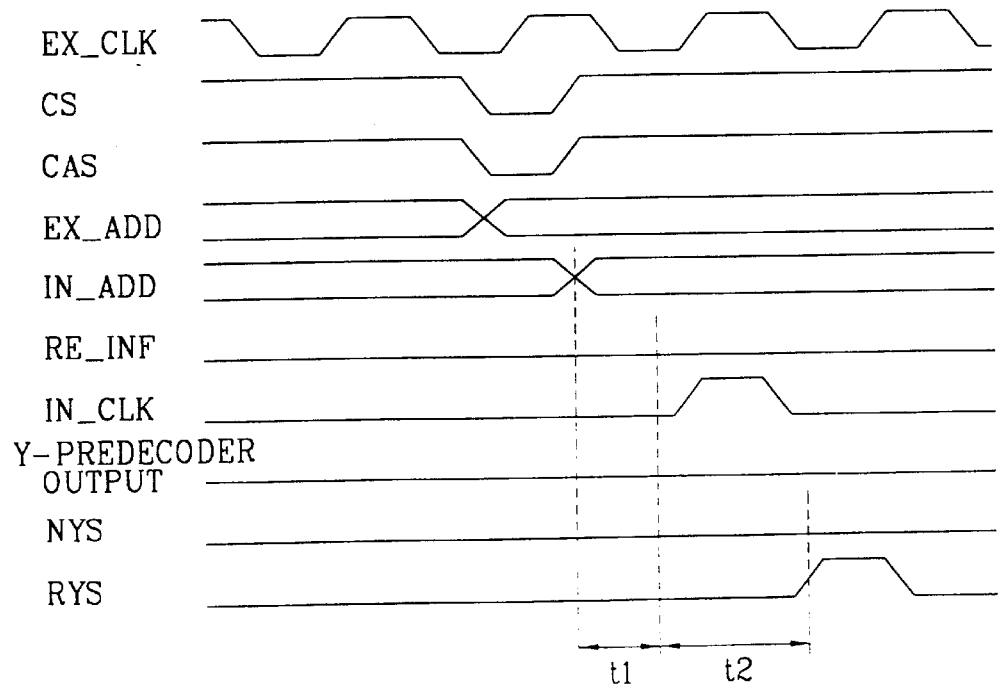
FIG. 2B is a timing diagram of the circuit of FIG. 1 in a redundancy mode.
Figure 3:
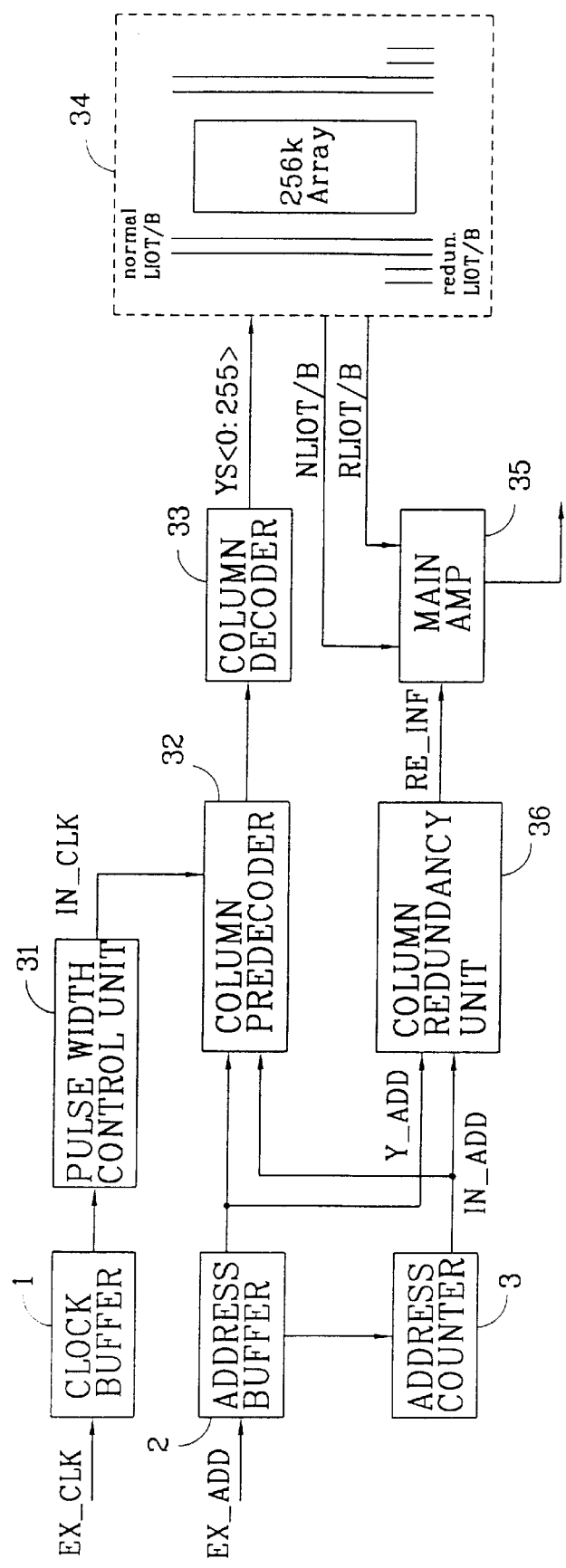
FIG. 3 is a block diagram illustrating another conventional redundancy circuit of a semiconductor memory.
Figure 7B:
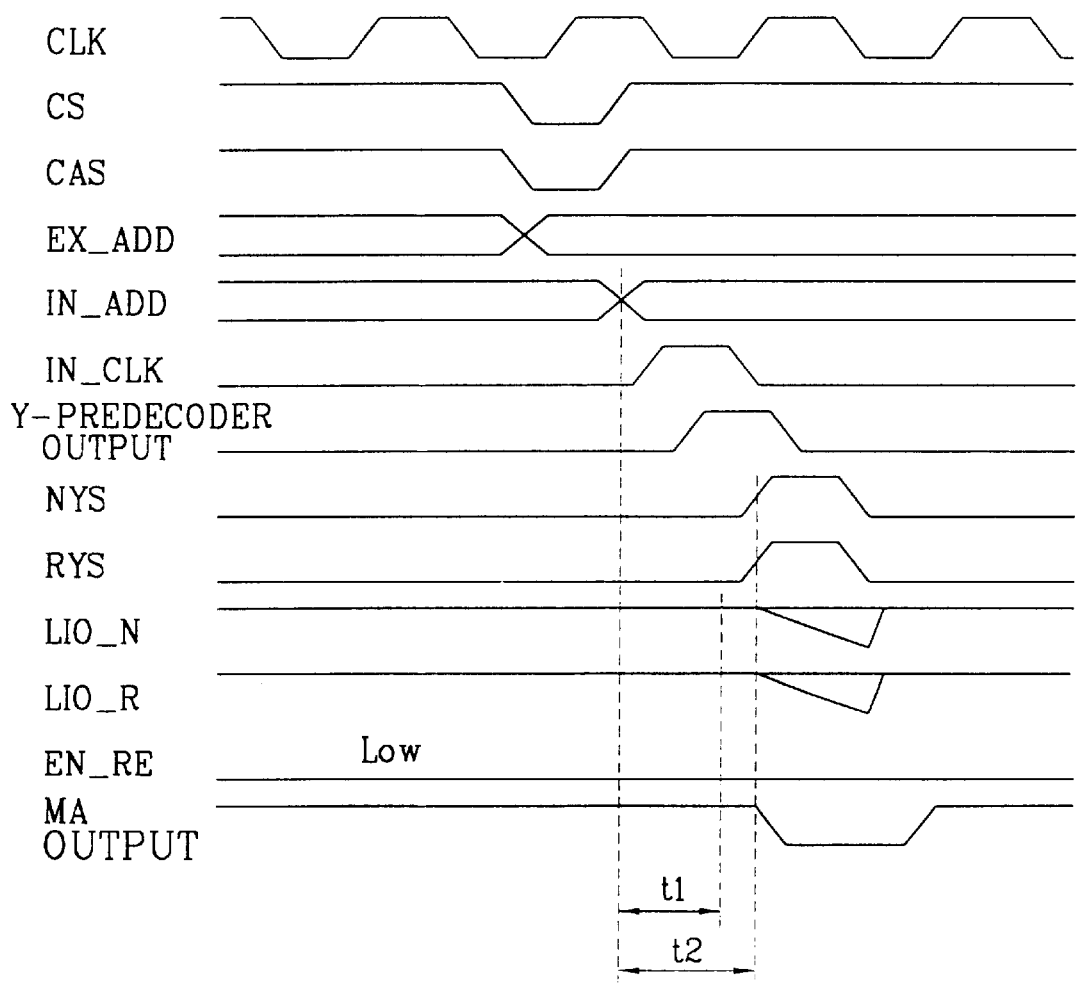
FIG. 7B is a timing diagram of the circuit in FIG. 4 in a redundancy mode.

FIGS. 7A and 7B are timing diagrams of the circuit in FIG. 4. FIG. 7A is a timing diagram in a non-redundancy mode, and FIG. 7B is a timing diagram in a redundancy mode. Referring to FIGS. 7A and 7B, the points where the external address EX_ADD and the internal address IN_ADD transition are identical as shown in FIGS. 2A and 2B. However, referring to FIGS. 2A and 2B, the redundancy clock signal IN_CLK becomes a high level when a first predetermined time t1 lapses after the internal address IN_ADD transitions. According to the preferable embodiment of the present invention, as depicted in FIGS. 7A and 7B, the redundancy clock signal IN_CLK becomes a high level as soon as the internal address IN_ADD changes state. In the conventional art, the normal column selecting signal NYS and the redundancy column selecting signal RYS are outputted when the first predetermined time t1 and the second predetermined time t2 sequentially lapse after the internal address IN_ADD changes state. However, in accordance with the preferable embodiment of the present invention, the normal column selecting signal NYS and the redundancy column selecting signal RYS are outputted when the second predetermined time t2 lapses after the internal address IN_ADD transitions. Accordingly, the present invention reduces redundancy enable signal delay by the time from an internal address transition time to an output time of the redundancy clock signal (i.e., the first predetermined time t1).

As discussed earlier, the column redundancy circuit in accordance with the present invention improves speed by switching the data outputted from the memory array according to the redundancy information. In addition, in the normal mode, the normal data outputted from the memory array is amplified in the main amplifier, and in the redundancy mode, the redundancy data outputted from the memory array is amplified in the main amplifier. As a result, the present invention can be applied even when a load of the input/output line is high. Furthermore, the present invention can be also applied to a high integration semiconductor memory circuit.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalents of such meets and bounds are therefore intended to be embraced by the appended claims.

What is claimed is:

1. A column redundancy circuit for a semiconductor memory, comprising:

a memory array including a plurality of array units respectively having a plurality of normal memory cells and a plurality of redundancy memory cells, each array unit outputting a normal data stored in the normal memory cell, and outputting a redundancy data stored in the redundancy memory cell;

a column redundancy unit for outputting a redundancy enable signal according to a column address, a row address and a fuse short state, said column redundancy unit including a plurality of enable units for respectively outputting a column address true signal or a column address bar signal according to the row address and the fuse state; and a switch unit for selecting one of the normal data and the redundancy data from the memory array according to a logical state of the redundancy enable signal, and for outputting the selected data to a main amplifier, wherein each enable unit includes a switching transistor being switched according to the row address;

a first transmission gate for outputting the column address true signal according to an ON/OFF state of the switching transistor; and a second transmission gate for outputting the column address bar signal according to the ON/OFF state of the switching transistor, the first and second transmission gates having a complementary relationship.

2. The column redundancy circuit according to claim 1, further comprising:

a pulse width control unit for outputting an internal clock signal in order to control a pulse width of a column selecting signal according to a buffered external clock signal.

3. The column redundancy circuit according to claim 1, wherein the memory array comprises:

a plurality of local normal input/output lines connected to the normal memory cells;

a plurality of local redundancy input/output lines connected to the redundancy memory cells;

a global normal input/output line for connecting the plurality of local normal input/output lines to the switching unit; and a global redundancy input/output line for connecting the plurality of local redundancy input/output lines to the switching unit.

4. The column redundancy circuit according to claim 1, wherein a number of the enable units is identical to a number of column address bits.

5. The column redundancy circuit according to claim 1, further comprising:

a column decoder for receiving a predecoded column address and an internal clock signal, and for outputting a normal column selecting signal and a redundancy column selecting signal to the memory array.

6. A column redundancy circuit for a semiconductor memory, comprising:
- a memory array including a plurality of array units respectively having a plurality of normal memory cells and a plurality of redundancy memory cells, each array unit outputting a normal data stored in the normal memory cell, and outputting a redundancy data stored in the redundancy memory cell;
- a column redundancy unit for outputting a redundancy enable signal according to a column address, a row address and a fuse short state, said column redundancy unit including a plurality of enable units for respectively outputting a column address true signal or a column address bar signal according to the row address and the fuse state; and
- a switch unit for selecting one of the normal data and the redundancy data from the memory array according to a logical state of the redundancy enable signal, and for outputting the selected data to a main amplifier,
- wherein each enable unit includes
- a switching transistor being switched according to the row address;
- a NAND gate having one input terminal connected to a read/write enable signal, and having another input terminal connected to the switching transistor via a fuse;
- a first transmission gate being switched according to a logical level of the another input terminal and the output terminal of the NAND gate, and outputting the column address true signal; and
- a second transmission gate being switched according to a logical level of the another input terminal and the output terminal of the NAND gate, and outputting the column address bar signal, the first and second transmission gates having a complementary relationship.

7. A column redundancy circuit for a semiconductor memory, comprising:
- a memory array including a plurality of array units respectively having a plurality of normal memory cells and a plurality of redundancy memory cells, each array unit outputting a normal data stored in the normal memory cell, and outputting a redundancy data stored in the redundancy memory cell;
- a column redundancy unit for outputting a redundancy enable signal according to a column address, a row address and a fuse short state, said column redundancy unit including a combination unit for combining signals outputted from the plurality of enable units, and for outputting the redundancy enable signal; and
- a switch unit for selecting one of the normal data and the redundancy data from the memory array according to a logical state of the redundancy enable signal, and for outputting the selected data to a main amplifier,
- wherein the combination unit includes
- a plurality of NAND gates for NANDing signals outputted from the plurality of enable units;
- a NOR gate for NORing outputs from the plurality of NAND gates; and
- two inverters for buffering an output from the NOR gate, and for outputting the redundancy enable signal.

8. The column redundancy circuit according to claim 7, wherein the combination unit outputs the redundancy enable signal at a high level when the signals outputted from the plurality of enable units are all at a high level.

9. A column redundancy circuit for a semiconductor memory, comprising:
- a memory array including a plurality of array units respectively having a plurality of normal memory cells and a plurality of redundancy memory cells, each array unit outputting a normal data stored in the normal memory cell, and outputting a redundancy data stored in the redundancy memory cell;
- a column redundancy unit for outputting a redundancy enable signal according to a column address, a row address and a fuse short state; and
- a switch unit for selecting one of the normal data and the redundancy data from the memory array according to a logical state of the redundancy enable signal, and for outputting the selected data to a main amplifier,
- wherein the switch unit includes
- a buffer unit for receiving the redundancy enable signal, and for outputting the redundancy switching signal and the normal switching signal;
- a redundancy switch being switched according to the redundancy switching signal, and transmitting the redundancy data from the memory array to the main amplifier; and
- a normal switch being switched according to the normal switching signal, and transmitting the normal data from the memory array to the main amplifier, a logical level of the redundancy switching signal being opposite to a logical level of the normal switching signal.

10. The column redundancy circuit according to claim 9, wherein the buffer unit comprises:
- a NAND gate for NANDing the redundancy enable signal and the read/write enable signal;
- first and second inverters for buffering an output from the NAND gate, and for outputting the redundancy switching signal;
- a third inverter for inverting the read/write enable signal;
- a NOR gate for NORing an output from the third inverter and the redundancy enable signal; and
- a fourth inverter for inverting an output from the NOR gate, and for outputting the normal switching signal.

11. A column redundancy circuit for a memory array having a plurality of array units, each array unit outputting a normal data from normal memory cells and a redundancy data from redundancy memory cells, the column redundancy circuit comprising:
- a column decoder to output a normal column selecting signal and a redundancy column selecting signal to the memory array based on a column address;
- a column redundancy unit to output a redundancy enable signal based on a row address;
- a switch unit to select one of the normal data and the redundancy data output from the memory array based on the redundancy enable signal, said switch unit including
  - a buffer unit for receiving the redundancy enable signal, and for outputting the redundancy switching signal and the normal switching signal;
  - a redundancy switch being switched according to the redundancy switching signal, and transmitting the redundancy data from the memory array to the main amplifier; and
  - a normal switch being switched according to the normal switching signal, and transmitting the normal data from the memory array to the main amplifier, a logical level of the redundancy switching signal being opposite to a logical level of the normal switching signal; and a main amplifier unit to amplify the selected data received from the switch unit.

12. The column redundancy circuit according to claim 11, wherein the switch unit comprises:

a plurality of pairs of switches, each pair outputting either the normal data or the redundancy data at a common output.

13. The column redundancy circuit according to claim 12, wherein the main amplifier unit comprises:

a plurality of amplifiers, each amplifier being connected to the common output of a corresponding pair of switches in the switch unit.

14. The column redundancy circuit according to claim 11, further comprising:

a pulse width control unit for outputting an internal clock signal in order to control a pulse width of a column selecting signal according to a buffered external clock signal.

15. The column redundancy circuit according to claim 11, wherein the column redundancy unit comprises:

a plurality of enable units for respectively outputting a column address true signal or a column address bar signal according to the row address and a fuse state; and a combination unit for combining signals outputted from the plurality of enable units, and for outputting the redundancy enable signal.

16. The column redundancy circuit according to claim 15, wherein the combination unit outputs the redundancy enable signal at a high level when the signals outputted from the plurality of enable units are all at a high level.

* * * * *